United States Patent
Liu et al.

(10) Patent No.: US 9,356,163 B1
(45) Date of Patent: May 31, 2016

(54) STRUCTURE AND METHOD OF INTEGRATING WAVEGUIDES, PHOTODETECTORS AND LOGIC DEVICES

(71) Applicant: International Business Machines Corporation, Armonk, NY (US)

(72) Inventors: Fei Liu, Yorktown Heights, NY (US); Christine Q. Ouyang, Yorktown Heights, NY (US); Alexander Reznicek, Troy, NY (US); Jeremy D. Schaub, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/741,007

(22) Filed: Jun. 16, 2015

(51) Int. Cl.
| | |
|---|---|
| *H01L 27/12* | (2006.01) |
| *H01L 31/0232* | (2014.01) |
| *H01L 27/144* | (2006.01) |
| *H01L 31/18* | (2006.01) |
| *H01L 27/146* | (2006.01) |
| *H01L 31/105* | (2006.01) |

(52) U.S. Cl.
CPC ...... *H01L 31/02327* (2013.01); *H01L 27/1443* (2013.01); *H01L 27/1463* (2013.01); *H01L 27/14609* (2013.01); *H01L 27/14612* (2013.01); *H01L 27/14625* (2013.01); *H01L 27/14634* (2013.01); *H01L 27/14643* (2013.01); *H01L 31/105* (2013.01); *H01L 31/184* (2013.01); *H01L 31/1804* (2013.01); *H01L 31/1808* (2013.01)

(58) Field of Classification Search
None
See application file for complete search history.

(56) References Cited

U.S. PATENT DOCUMENTS

| | | | |
|---|---|---|---|
| 7,110,629 B2 | 9/2006 | Bjorkman et al. | |
| 7,160,753 B2 | 1/2007 | Williams, Jr. | |
| 7,262,117 B1 | 8/2007 | Gunn, III et al. | |
| 7,927,979 B2 | 4/2011 | Hill et al. | |
| 8,242,564 B2 | 8/2012 | Spencer et al. | |
| 8,299,485 B2 | 10/2012 | Celler | |
| 8,633,067 B2 | 1/2014 | Assefa et al. | |
| 8,859,394 B2 | 10/2014 | Dallesasse et al. | |
| 8,895,413 B2 | 11/2014 | Pinguet et al. | |
| 2003/0021538 A1* | 1/2003 | Yamamoto | G02B 6/13 385/49 |
| 2013/0039614 A1 | 2/2013 | Shubin et al. | |
| 2014/0027826 A1* | 1/2014 | Assefa | H01L 35/34 257/290 |
| 2014/0185981 A1* | 7/2014 | Assefa | G06F 17/5068 385/14 |

* cited by examiner

*Primary Examiner* — Minh-Loan Tran
(74) *Attorney, Agent, or Firm* — Scully, Scott, Murphy & Presser, P.C.; Steven J. Meyers

(57) ABSTRACT

A method for monolithically integrating semiconductor waveguides, photodetectors and logic devices, i.e., field effect transistors, on a same substrate is provided. The method includes the use of a double semiconductor-on-insulator substrate that includes from bottom to top, a handle substrate, a first insulator layer, a first semiconductor material layer, a second insulator layer, and a second semiconductor material layer. The waveguides, photodetectors and logic devices can be formed in different regions of the substrate and are present atop a first insulator layer of the double semiconductor-on-insulator substrate.

20 Claims, 8 Drawing Sheets

STRUCTURE AND METHOD OF INTEGRATING WAVEGUIDES, PHOTODETECTORS AND LOGIC DEVICES

BACKGROUND

The present application relates to a semiconductor structure and a method of forming the same. More particularly, the present application relates to a method for monolithically integrating semiconductor waveguides, photodetectors and logic devices, i.e., field effect transistors, on a same substrate. The present application also relates to a semiconductor structure that includes a semiconductor waveguide, a photodetector and a logic device integrated on a same substrate.

Silicon photonics can potentially improve both on-chip and off-chip communication bandwidth. In some cases, light can be routed across the chip using silicon waveguides at an optical wavelength of 1.3 microns or 1.55 microns, and sensed using semiconductor photodetectors and complementary metal oxide semiconductor (CMOS) amplifiers. The integration of silicon photonics with photodetectors and CMOS type devices enables "point-to-point" communication links or "one-to-many" communication links. One problem with such a system is that it remains difficult to integrate silicon photonics with photodetectors and CMOS type devices utilizing a same substrate.

SUMMARY

A simple and cost effective method of integrating photonic devices with photodetectors and CMOS type devices using the same substrate is needed. In one aspect of the present application, a method of integrating semiconductor waveguides, photodetectors and logic devices, i.e., field effect transistors, on a same substrate is provided. In one embodiment, the method includes providing a substrate comprising, from bottom to top, a handle substrate, a first insulator layer, a first semiconductor material layer, a second insulator layer, and a second semiconductor material layer. An opening is then formed that extends entirely through the second semiconductor material layer and entirely through the second insulator layer, and partially into the first semiconductor material layer. A third semiconductor material layer is formed in the opening. The third semiconductor material layer has a bottommost surface that contacts a reduced thickness material portion of the first semiconductor material layer that is located under the opening. Next, isolation structures are formed in the semiconductor substrate to provide a waveguide device region, a photodetector device region and a logic device region. During the formation of the isolation structures, portions of the first semiconductor material layer, portions of the third semiconductor material layer and portions of the second semiconductor material layer are removed. The waveguide device region comprises a first remaining portion of the first semiconductor material layer. The photodetector device region comprises a remaining portion of the third semiconductor material layer and the reduced thickness material portion of the first semiconductor material layer. The logic device region comprises a remaining portion of the second semiconductor material layer, a remaining portion of the second insulator layer, and a second remaining portion of the first semiconductor material layer. Next, a logic device is formed on a surface of the remaining portion of the second semiconductor material layer in the logic device region, and a photodetector device is formed in the remaining portion of the third semiconductor material layer in the photodetector device region.

In some embodiments, the method also includes removing another remaining portion of the second semiconductor material layer and another remaining portion of the second insulator layer and forming a topmost waveguide dielectric structure on the first remaining portion of the first semiconductor material layer prior to forming the isolation structures.

In another aspect of the present application, a semiconductor structure is provided that includes a semiconductor waveguide, a photodetector and a logic device integrated on a same substrate. In one embodiment, the semiconductor structure includes an insulator layer located on an entire surface of a handle substrate. A waveguide is located atop a first portion of the insulator layer. The waveguide comprises, from top to bottom, a topmost waveguide dielectric structure, a waveguide core structure comprising a first semiconductor material, and a bottommost waveguide dielectric structure comprising the first portion of the insulator layer. A photodetector is located above a second portion of the insulator layer. The photodetector comprises a photodetector semiconductor base layer comprising a third semiconductor material that is located on a surface of an epitaxial seed material layer comprising the first semiconductor material. A logic device is spaced apart from the waveguide and the photodetector and located above a third portion of the insulator layer. The logic device is present on a surface of an active semiconductor material layer comprising a second semiconductor material, and the active semiconductor material layer is separated from the third portion of the insulator layer by a local buried insulator layer and a logic device semiconductor material substrate comprising the first semiconductor material.

DETAILED DESCRIPTION

Figure 1:
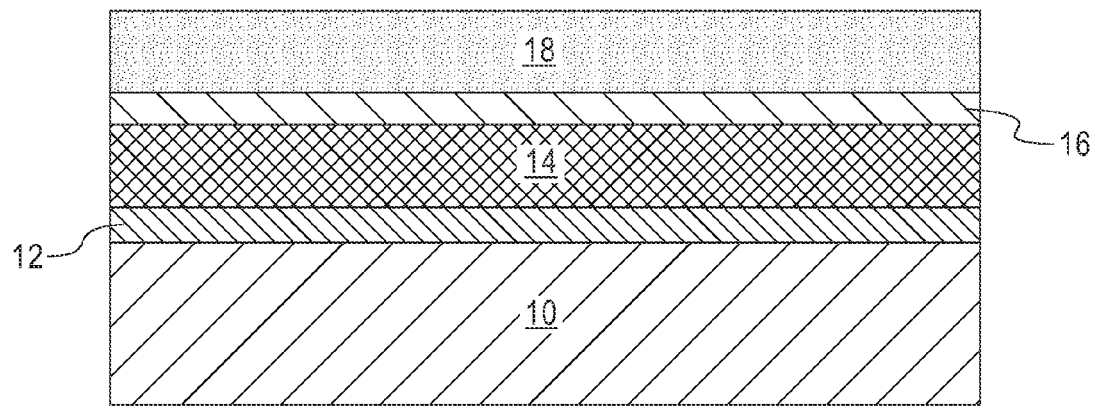
FIG. 1 is a cross sectional view of an exemplary semiconductor structure including, from bottom to top, a handle substrate, a first insulator layer, a first semiconductor material layer, a second insulator layer, and a second semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including, from bottom to top, a handle substrate 10, a first insulator layer 12, a first semiconductor material layer 14, a second insulator layer 16, and a second semiconductor material layer 18 that can be employed in accordance with an embodiment of the present application. Collectively, the structure including the handle substrate 10, the first insulator layer 12, the first semiconductor material layer 14, the second insulator layer 16, and the second semiconductor material layer 18 can be referred to herein as a double semiconductor-on-insulator (SOI) substrate.

In some embodiments of the present application, the handle substrate 10 of the double SOI substrate may comprise a semiconductor material. The term "semiconductor" as used herein in connection with the semiconductor material of the handle substrate 10 (or any other semiconductor material described herein) denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the handle substrate 10 may be comprised of silicon. In some embodiments, the handle substrate 10 is a non-semiconductor material including, for example, a dielectric material and/or a conductive material.

The first insulator layer 12 of the exemplary semiconductor structure shown in FIG. 1 may be a crystalline or non-crystalline oxide and/or nitride. In one embodiment, the first insulator layer 12 is an oxide such as, for example, silicon dioxide. In another embodiment, the first insulator layer 12 is a nitride such as, for example, silicon nitride or boron nitride. In yet still another embodiment of the present application, the first insulator layer 12 may be a multilayered structure such as a stack of, in any order, silicon dioxide and boron nitride. The thickness of the first insulator layer 12 that may be used in the present application can be from 10 nm to 200 nm. Other thicknesses that are lesser than, or greater than, the aforementioned thickness range for the first insulator layer 12 can also be used in the present application.

The first semiconductor material layer 14 comprises a first semiconductor material that may comprise one of the semiconductor materials mentioned above for the handle substrate 10. In one embodiment, the first semiconductor material layer 14 comprises a same semiconductor material as the handle substrate 10. In another embodiment, the first semiconductor material layer 14 comprises a different semiconductor material than the handle substrate 10. In one embodiment, the first semiconductor material layer 14 comprises silicon. The thickness of the first semiconductor material layer 14 that can be used in the present application can be from 10 nm to 150 nm. Other thicknesses that are lesser than, or greater than, the aforementioned range can also be employed in the present application as the thickness of the first semiconductor material layer 14.

The second insulator layer 16 of the exemplary semiconductor structure shown in FIG. 1 may comprise one of the dielectric materials mentioned above for the first insulator layer 12. In one embodiment of the present application, the first and second insulator layers (12, 16) comprise a same material. In one example, the first and second insulator layers (12, 16) both comprise silicon dioxide or silicon nitride or boron nitride or any multilayered stack of such dielectric materials. In another embodiment of the present application, the second insulator layer 16 comprises a different dielectric material than the first insulator layer 12. The thickness of the second insulator layer 16 that may be used in the present application can be from 10 nm to 200 nm. Other thicknesses that are lesser than, or greater than, the aforementioned thickness range for the second insulator layer 16 can also be used in the present application. The thickness of the second insulator layer 16 can be equal to, less than or greater than the thickness of the first insulator layer 12.

The second semiconductor material layer 18 comprises a second semiconductor material that may comprise one of the semiconductor materials mentioned above for the handle substrate 10. In one embodiment, the second semiconductor material layer 18 comprises a same semiconductor material as the first semiconductor material 14. In one example, the first and second semiconductor material layers (14, 18) both comprise silicon or germanium or a silicon germanium alloy or a III-V compound semiconductor. In another embodiment, the second semiconductor material layer 18 comprises a different semiconductor material than the first semiconductor material layer 14. In one example, the first semiconductor material layer 14 comprises silicon, while the second semiconductor material layer 18 comprises germanium, a silicon germanium alloy or a III-V compound semiconductor. The thickness of the second semiconductor material layer 18 that can be used in the present application can be from 10 nm to 150 nm. Other thicknesses that are lesser than, or greater than, the aforementioned range can also be employed in the present application as the thickness of the second semiconductor material layer 18. The thickness of the second semiconductor material layer 18 may be equal to, less than, or greater than the thickness of the first semiconductor material layer 14.

In some embodiments, the handle substrate 10, the first semiconductor material layer 14 and/or the second semiconductor material layer 18 may have a same crystal orientation. In other embodiments, the handle substrate 10 and the first semiconductor material layer 14 or the handle substrate 10 and the second semiconductor material layer 18 may have different crystal orientations. In some embodiments, at least the first and second semiconductor material layers (14, 18) comprise a same crystallographic orientation. The crystal orientation of the handle substrate 10 and/or the first semiconductor material layer 14 and/or the second semiconductor material layer 18 may be {100}, {110}, or {111}. Other crystallographic orientations besides those specifically mentioned can also be used in the present application. The handle substrate 10 may be a single crystalline semiconductor material, a polycrystalline material, or an amorphous material. The first and the second semiconductor material layers (14, 18) are typically comprised of a single crystalline semiconductor material such as, for example, single crystalline silicon.

The exemplary semiconductor structure shown in FIG. 1 can be formed utilizing standard processes known in the art. In one example, a layer transfer process including wafer bonding may be used to provide the exemplary semiconductor structure shown in FIG. 1. In another embodiment, two different SIMOX (Separation by IMplantation of OXygen) may be used in providing the exemplary semiconductor structure shown in FIG. 1.

Figure 2:
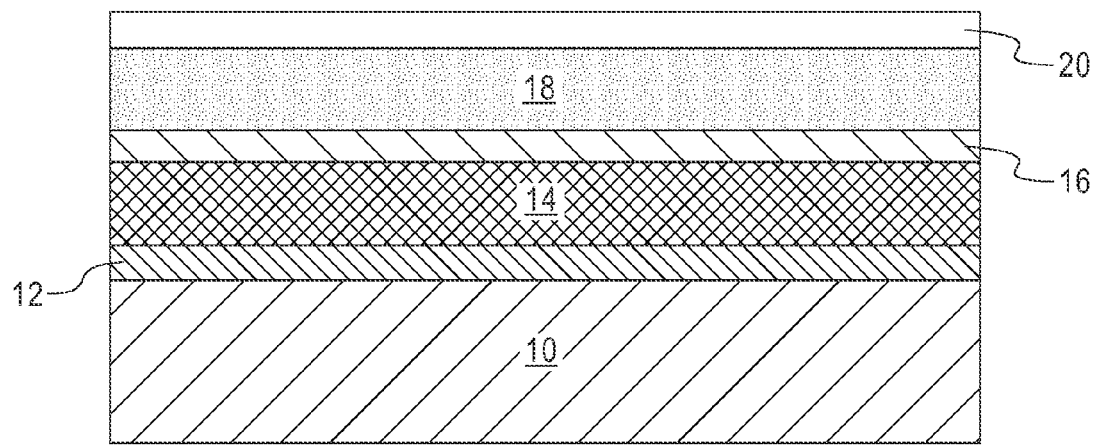
FIG. 2 is a cross sectional view of the exemplary semiconductor structure of FIG. 1 after forming a hard mask layer on a surface of the second semiconductor material layer.

Referring now to FIG. 2, there is illustrated the exemplary semiconductor structure of FIG. 1 after forming a hard mask layer 20 on a surface of the second semiconductor material layer 18. The hard mask layer 20 that can be employed is a contiguous layer that covers the entirety of the topmost surface of the double SOI substrate shown in FIG. 1.

The hard mask layer 20 that can be employed in the present application may include a hard mask material such as, for example, a semiconductor oxide, a semiconductor nitride and/or a semiconductor oxynitride. In one embodiment, the hard mask material that can be used in providing the hard mask layer 20 can be comprised of silicon dioxide. In another embodiment, the hard mask material that can be used in providing the hard mask layer 20 can be comprised of silicon nitride. In yet another embodiment, the hard mask material that can be used in providing the hard mask layer 20 can be a stack comprised of, in any order, silicon dioxide and silicon nitride.

In some embodiments of the present application, the hard mask material that can be used in providing the hard mask layer 20 can be formed by a deposition process such as, for example, chemical vapor deposition (CVD) or plasma enhanced chemical vapor deposition (PECVD). In other embodiments, the hard mask material that can be used in providing the hard mask layer 20 can be formed by a thermal process such as, for example, thermal oxidation and/or thermal nitridation. In yet other embodiments, the hard mask material that can be used in providing the hard mask layer 20 can be formed by a combination of a deposition process and a thermal process. The thickness of the hard mask material that can be used in providing the hard mask layer 20 can range from 2 nm to 10 nm, although other thickness that are lesser than or greater than the aforementioned thickness range can be used for the hard mask layer 20.

Figure 3:
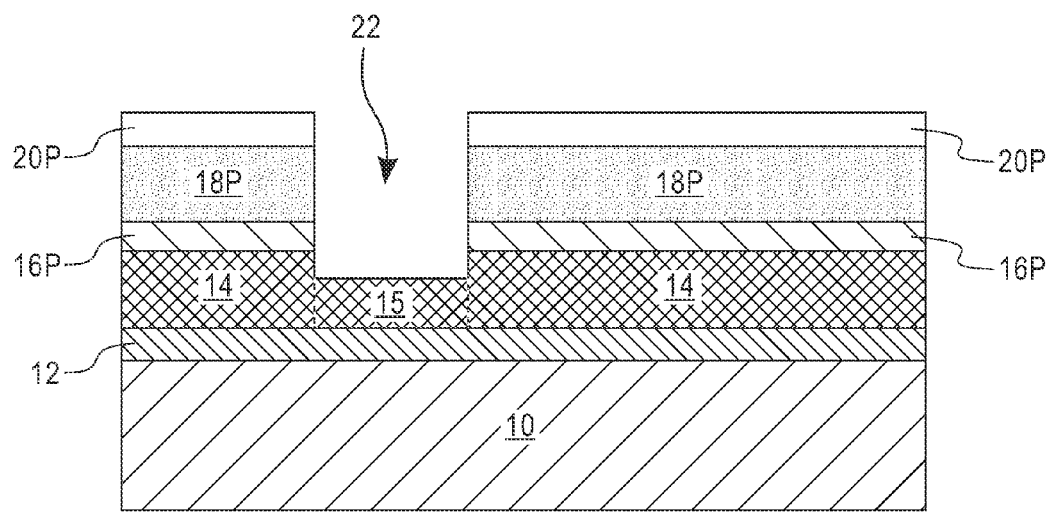
FIG. 3 is cross sectional view of the exemplary semiconductor structure of FIG. 2 after forming an opening that extends entirely through the hard mask layer, the second semiconductor material layer, and the second insulator layer, and partially into the first semiconductor material layer.

Referring now to FIG. 3, there is illustrated the exemplary semiconductor structure of FIG. 2 after forming an opening 22 that extends entirely through the hard mask layer 20, the second semiconductor material layer 18, and the second insulator layer 16, and partially into the first semiconductor material layer 14. Although a single opening 22 is described and illustrated, a plurality of such openings can be formed into the exemplary semiconductor structure shown in FIG. 2.

In one embodiment of the present application, opening 22 can be formed by lithography and etching. Lithography includes forming a photoresist material (not shown) on a topmost surface of the hard mask layer 20. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the hard mask layer 20. The pattern provided by the patterned photoresist material is thereafter transferred into the underlying material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

As mentioned above, the opening 22 is formed entirely through the hard mask layer 20, the second semiconductor material layer 18, and the second insulator 16, and partially into the first semiconductor material layer 14. Thus, and after forming opening 22, portions of the hard mask layer 20, portions of the second semiconductor material layer 18, and portions of the second insulator layer 16 remain. Each remaining portion of the hard mask layer 20 can be referred to a hard mask layer portion 20P, each remaining portion of the second semiconductor material layer 18 may be referred to as second semiconductor material layer portion 18P, and each remaining portion of the second insulator layer 16 may be referred to as a second insulator layer portion 16P.

The opening 22 that is formed is only partially formed into the first semiconductor material layer 14 such that a reduced thickness material portion 15 of the first semiconductor material layer 14 remains beneath the bottommost horizontal surface of the opening 22; in the drawings dotted lines are shown by way of illustration only to indicate the location of the reduced thickness material portion 15 of the first semiconductor material layer 14. The reduced thickness material portion 15 of the first semiconductor material layer 14 will be used in a subsequent step of the present application as a seed layer for epitaxially growing (or depositing) a third semiconductor material layer. The reduced thickness material portion 15 of the first semiconductor material layer 14 has a thickness (i.e., height) that is less than the original thickness (i.e., height) of the first semiconductor material layer 14.

Figure 4:
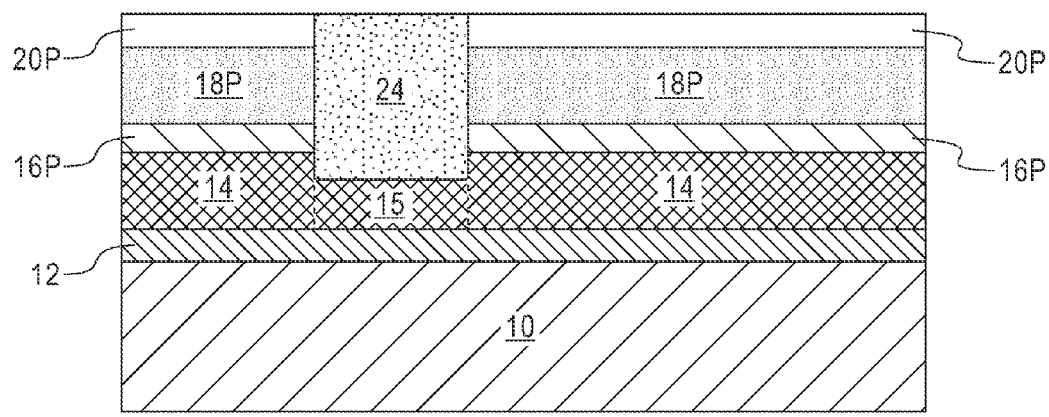
FIG. 4 is a cross sectional view of the exemplary semiconductor structure of FIG. 3 after forming a third semiconductor material layer in the opening.

Referring now to FIG. 4, there is illustrated the exemplary semiconductor structure of FIG. 3 after forming a third semiconductor material layer 24 in the opening 22. In accordance with the present application, and as mentioned above, the reduced thickness material portion 15 of the first semiconductor material layer 14 that lies beneath the opening 22 provided above is used in this step of the present application as a seed layer for epitaxially growing (or depositing) the third semiconductor material layer 24.

The third semiconductor material layer 24 comprises a third semiconductor material that may include one of the semiconductor materials mentioned above for handle substrate 10. For example, the third semiconductor material layer 24 may comprise silicon, germanium or a silicon germanium alloy. In one embodiment, the third semiconductor material layer 24 comprises a semiconductor material that is the same as the semiconductor material that provides the first semiconductor material layer 14. In another embodiment, the third semiconductor material layer 24 comprises a semiconductor material that is different from the semiconductor material that provides the first semiconductor material layer 14.

As mentioned above, the third semiconductor material layer 24 is formed utilizing an epitaxial growth or epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a orientation. As such, the third semiconductor material layer 24 has an epitaxial relationship, i.e., same crystal orientation, as that of the exposed surface of the reduced thickness material portion 15 of the first semiconductor material layer 14.

Examples of various epitaxial growth processes that are suitable for use in forming the third semiconductor material layer 24 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking. A number of well know semiconductor precursor source gases may be used for the deposition of the third semiconductor material layer 24. Carrier gases like hydrogen, nitrogen, helium and argon can be used.

As is shown in FIG. 4, the third semiconductor material layer 24 completely fills the volume of opening 22 and has sidewall surfaces that contact sidewall surfaces of the first semiconductor material layer 14, sidewall surfaces of each second insulator layer portion 16P, sidewall surfaces of each second semiconductor material layer portion 18P, and sidewall surfaces of each hard mask layer portion 20P. The third semiconductor material layer 24 also has a bottommost surface that contacts the reduced thickness material portion 15 of the first semiconductor material layer 14 that is used as the epitaxial seed layer and a topmost surface that is coplanar with a topmost surface of each hard mask layer portion 20P. In some embodiments, and after the epitaxial growth process, a material removal process including, for example, chemical mechanical polishing or an etch back can be used to provide the exemplary semiconductor structure of FIG. 4.

Figure 5:
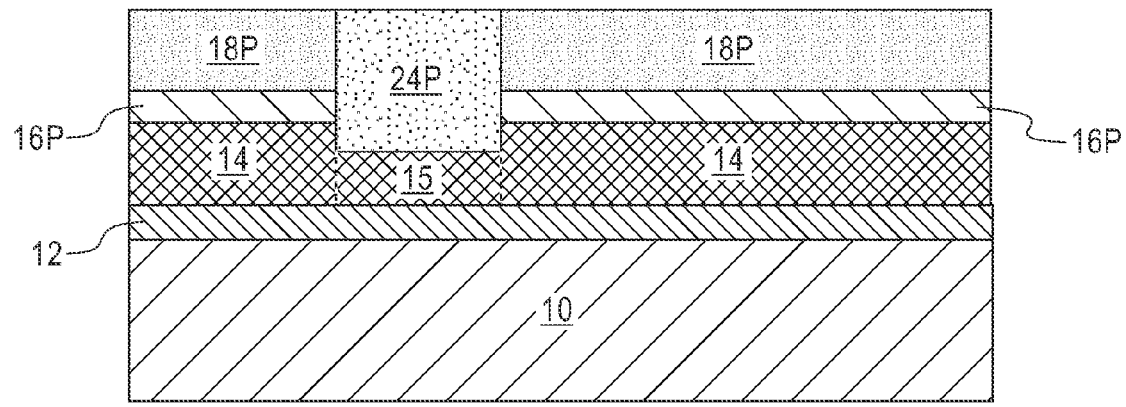
FIG. 5 is a cross sectional view of the exemplary semiconductor structure of FIG. 4 after performing a planarization process that stops on a topmost surface of each remaining portion of the second semiconductor material layer.

Referring now to FIG. 5, there is illustrated the exemplary semiconductor structure of FIG. 4 after performing a planarization process that stops on a topmost surface of each remaining portion of the second semiconductor material layer 18 (i.e., each second semiconductor layer portions 18P). During the planarization process, each hard mask layer portion 20P is entirely removed and an upper portion of the third semiconductor material layer 24 is removed. The remaining portion of the third semiconductor material layer 24 may be referred to herein as a third semiconductor material layer portion 24P. As is shown, the third semiconductor material portion 24P has a topmost surface that is coplanar with a topmost surface of each second semiconductor material layer portion 18P. The planarization process that can be used in providing the exemplary semiconductor structure shown in FIG. 5 may include chemical mechanical polishing and/or grinding.

Figure 6:
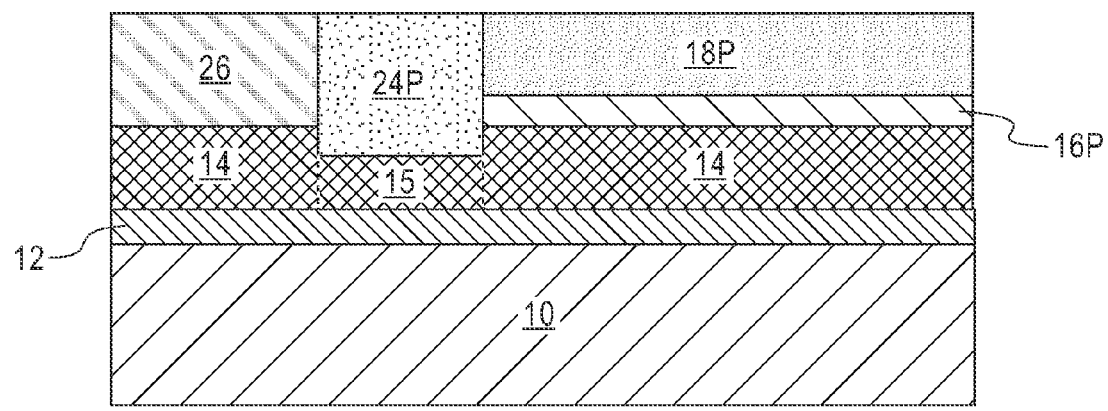
FIG. 6 is a cross sectional view of the exemplary semiconductor structure of FIG. 5 after removing one of the remaining portions of the second semiconductor material layer and one of one of the remaining portions of the second insulator layer that lie adjacent a sidewall surface of the third semiconductor material layer and forming a waveguide dielectric material structure on an exposed surface of a remaining portion of the first semiconductor material layer.

Referring now to FIG. 6, there is illustrated the exemplary semiconductor structure of FIG. 5 after forming removing one of the remaining portions of the second semiconductor material layer 18 (i.e., one of the second semiconductor material layer portions 18P) and one of the remaining portions of the second insulator layer 16 (i.e., one of the second insulator layer portions 16P) that lie adjacent a sidewall surface of the third semiconductor material layer portion 24P and forming a waveguide dielectric material 26 on an exposed surface of a remaining portion of the first semiconductor material layer 14.

The exemplary semiconductor structure shown in FIG. 6 can be formed by first providing a block mask (not shown) over portions of the exemplary semiconductor structure shown in FIG. 5, while leaving other portions of the exemplary semiconductor structure exposed. The block mask that can be used in the present application may include any material that can protect some areas of the exemplary semiconductor structure during processing of other preselected areas of the exemplary semiconductor structure. In one embodiment, the block mask may be composed of only a photoresist material. In another embodiment, the block mask may be composed of only a hard mask material. Examples of hard mask materials that can be used as a block mask include silicon dioxide, silicon nitride and/or silicon oxynitride. In another embodiment of the present application, the block mask may comprise a stack of, from bottom to top, a hard mask material and a photoresist material.

The block mask can be formed utilizing techniques that are well known to those skilled in the art. For example, the block mask can be formed by first depositing at least one of the above mentioned materials and then patterning the at least one deposited material by lithography. An anisotropic etching process such as, for example, reactive ion etching can also be used to complete any pattern transfer that may be needed; for example, an anisotropic etch may be used to transfer a pattern from a lithographically defined photoresist into the underlying material that may define the block mask.

After forming the block mask, at least one anisotropic etching process can be used to remove one of the second semiconductor layer portions 18P and one of the second insulator portions 16P from the exemplary semiconductor structure. In one example, at least one reactive ion etching process can be used to remove one of the second semiconductor layer portions 18P and one of the second insulator portions 16P from the exemplary semiconductor structure.

After removing one of the second semiconductor layer portions 18P and one of the second insulator portions 16P from the exemplary semiconductor structure, a surface of a portion of the first semiconductor material layer 14 is exposed. A waveguide dielectric material 26 is then formed on the exposed surface of the first semiconductor material layer 14. The waveguide dielectric material 26 may comprise any dielectric material that can serve to reflect light that passes through a portion of the underlying first semiconductor material layer 14. In one example, silicon dioxide and/or silicon nitride can be used as the dielectric material that provides the waveguide dielectric material 26. In some embodiments, the dielectric material that provides the waveguide dielectric material 26 can be formed utilizing a deposition process such as, for example, chemical vapor deposition or plasma enhanced chemical vapor deposition. In other embodiments, a thermal oxidation and/or nitridation process can be used to form the dielectric material that provides the waveguide dielectric material 26. An etch back process may follow the formation of the dielectric material that provides the waveguide dielectric material 26. After forming the waveguide dielectric material 26, the block mask mentioned above can be removed utilizing any well known material removal process including, for example, chemical mechanical polishing and/or an etch back.

As is shown, the topmost surface of the waveguide dielectric material 26 is coplanar with a topmost surface of the third semiconductor material layer portion 24P and a topmost surface of a remaining second semiconductor material portion 18P.

Figure 7A:
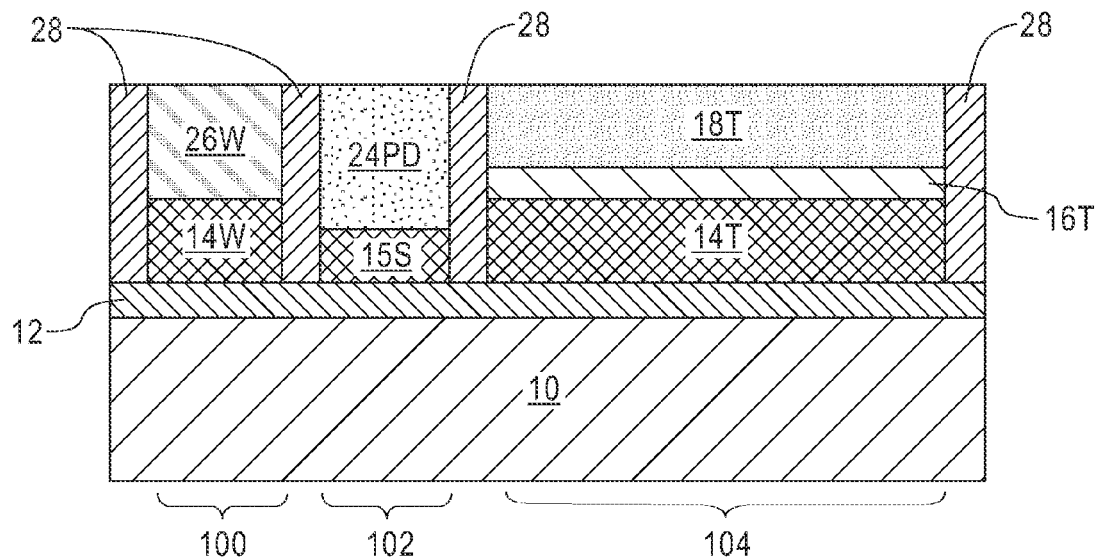
FIG. 7A is a cross sectional view of the exemplary semiconductor structure of FIG. 6 after forming isolation structures to provide a waveguide device region, a photodetector device region and a logic device region.
Figure 7B:
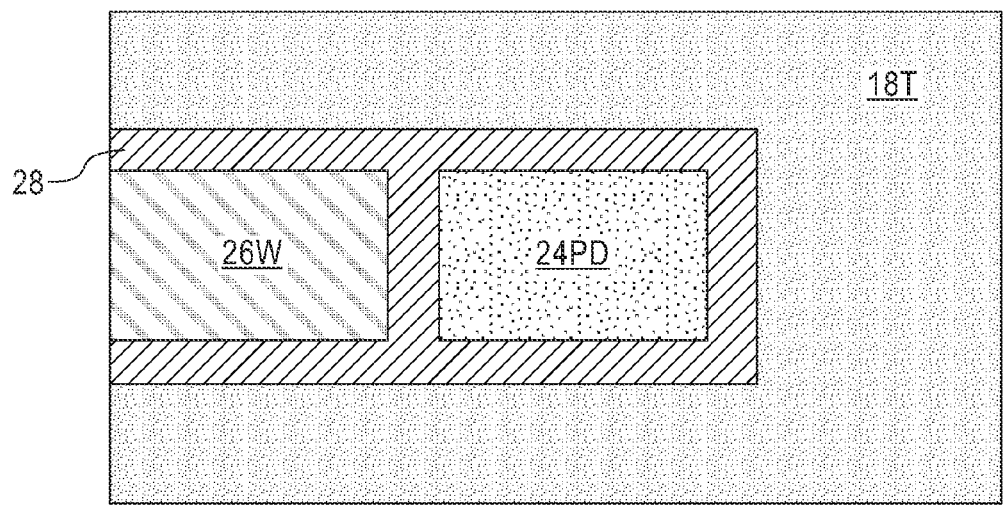
FIG. 7B is a top down view of the cross sectional view shown in FIG. 7A.

Referring now to FIGS. 7A-7B, there are illustrated various views of the exemplary semiconductor structure of FIG. 6 after forming isolation structures 28 to provide a waveguide device region 100, a photodetector device region 102 and a logic device region 104. The isolation structures 28 can also remove any defective area around the sidewall surfaces of the third semiconductor material layer portion 24P.

In the waveguide device region 100, the isolation structures 28 are formed entirely through a portion of the waveguide dielectric material 26 and entirely through an underlying portion of the first semiconductor material layer 14. The remaining waveguide dielectric material 26 within the waveguide device region 100 can be referred to herein as a topmost waveguide dielectric structure 26W; a portion of the first insulator layer 12 that is within the waveguide device region 100 serves as a bottommost waveguide dielectric structure. The remaining portion of the first semiconductor material layer 14 within the waveguide device region 100 can be referred to herein as a waveguide core structure 14W. Since waveguide core structure 14W comprises a portion of the first semiconductor material layer 14, the waveguide core structure 14W comprises the first semiconductor material. Collectively, a portion of the first insulator layer 12 within the waveguide device region 100, the waveguide core structure 14W and the topmost waveguide dielectric structure 26W provide a waveguide of the present application.

In the photodetector device region 102, the isolation structures 28 are formed entirely through a portion of the third semiconductor material layer portion 24P and entirely through a portion of the underlying reduced thickness material portion 15 of the first semiconductor material layer 14. The remaining portion of the third semiconductor material portion 24P within the photodetector device region 102 can be referred to herein as a photodetector semiconductor base layer 24PD; the photodetector semiconductor base layer 24PD comprises the third semiconductor material. The remaining reduced thickness material portion 15 of the first semiconductor material layer 14 within the photodetector device region 102 may be referred to herein as epitaxial seed material layer 15S; the epitaxial seed material layer 15S comprises the first semiconductor material.

In the logic device region 104, the isolation structures 28 are formed entirely through a portion of the second semiconductor material portion 18P, entirely through a remaining portion of the second insulator portion 16P and entirely through an underlying portion of the first semiconductor material layer 14. The remaining second semiconductor material portion 18P within the logic device region 104 can be referred to herein as an active semiconductor material layer 18T; the active semiconductor material layer 18T comprises the second semiconductor material. The remaining portion of the second insulator layer portion 16P in the logic device region 104 may be referred to as a local buried insulator layer 16T and the remaining semiconductor material portion layer 14 within the logic device region 104 may be referred to as a logic device semiconductor material substrate 14T; the logic device semiconductor material substrate 14T comprises the first semiconductor material.

The isolation structures 28 can be formed utilizing conventional techniques that are well known in the art. For example, trenches are first formed into the exemplary semiconductor structure shown in FIG. 6 by lithography and etching. Following the etch, each trench is then filled with a trench dielectric material such as, for example, a trench dielectric oxide. After filling of the trenches with the trench dielectric material, a planarization process may be used to provide the exemplary semiconductor structure in FIGS. 7A-7B. As is shown in FIG. 7A, each isolation structure 28 has a topmost surface that is coplanar with the topmost surface of each of the topmost waveguide dielectric structure 26W, the photodetector semiconductor baser layer 24PD 24P and the active semiconductor material layer 18T. As is further shown in FIG. 7A, the height of the epitaxial seed material layer 15S is less than the height of both the waveguide core structure 14W and the logic device semiconductor material substrate 14T.

Figure 8:
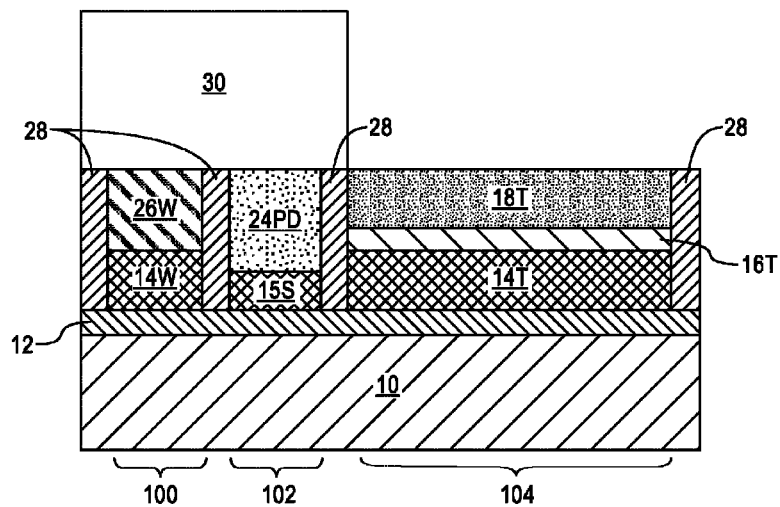
FIG. 8 is a cross sectional view of the exemplary semiconductor structure of FIGS. 7A-7B after forming a block mask over the waveguide device region and the photodetector device region in accordance with one embodiment of the present application.

Referring now to FIG. 8, there is illustrated the exemplary semiconductor structure of FIGS. 7A-7B after forming a block mask 30 over the waveguide device region 100 and the photodetector device region 102 in accordance with one embodiment of the present application. Block mask 30 does not cover the logic device region 104. Block mask 30 may include one of the block mask materials mentioned above in providing the exemplary semiconductor structure shown in FIG. 6. Also, block mask 30 can be formed utilizing one of the techniques mentioned above in providing the block mask used to provide the exemplary semiconductor structure shown in FIG. 6.

Figure 9:
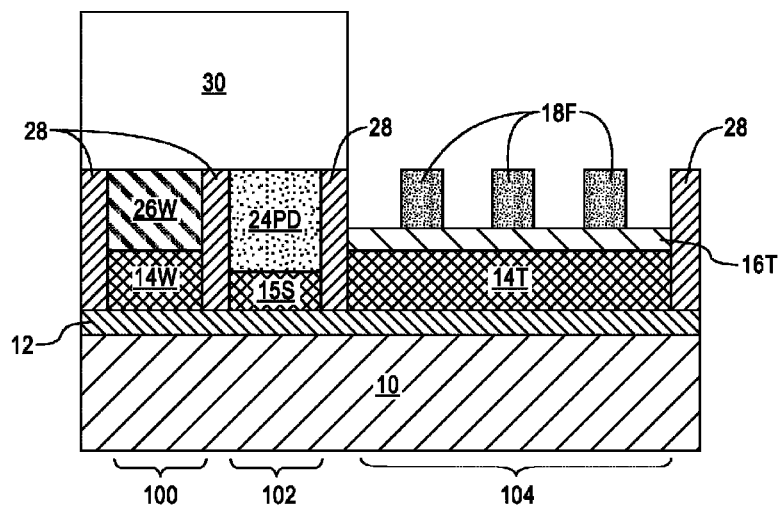
FIG. 9 is a cross sectional view of the exemplary semiconductor structure of FIG. 8 after patterning a remaining portion of the second semiconductor material layer in the logic device region to provide semiconductor fins extending upwards from a remaining portion of the second insulator layer in accordance with an embodiment of the present application.

Referring now to FIG. 9, there is illustrated the exemplary semiconductor structure of FIG. 8 after patterning a remaining portion of the second semiconductor material layer (i.e., the active semiconductor material layer 18T) in the logic device region 104 to provide semiconductor fins 18F extending upwards from a remaining portion of the second insulator layer (i.e., local buried insulator layer 16T). In some embodiments, fin formation may be omitted and the entirety of the active semiconductor material layer 18T in the logic device region 104 can be used to form a functional gate structure thereupon. See, FIG. 12.

In one embodiment of the present application, the patterning process comprises a sidewall image transfer (SIT) process. The SIT process includes forming a contiguous mandrel material layer (not shown) over the active semiconductor material layer 18T. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers entirely through the active semiconductor material layer 18T. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process that is used in providing the semiconductor fins 18F can include lithography and etching as defined above.

In any of the patterning processes mentioned above, a hard mask layer such as, for example, silicon dioxide and/or silicon nitride, may be formed on the topmost layer of the active semiconductor material layer 18T prior to patterning. After patterning, a remaining portion of the hard mask layer is present atop each topmost semiconductor fin. The portion of the hard mask layer that remains after patterning can be referred to herein as hard mask cap (not shown). The hard mask cap can be removed after patterning by a planarization process such as, for example, chemical mechanical planarization and/or grinding.

Each semiconductor fin 18F that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 18F that is formed has a height from 10 nm to 100 nm, and a width from 5 nm to 30 nm. Other heights and widths that are lesser than, or greater than, the aforementioned ranges may also be used in the present application for each semiconductor fin 18F. Each semiconductor fin 18F comprises the same semiconductor material as the second semiconductor material layer 18 mentioned above. Each semiconductor fin 18F is separated from its nearest neighboring semiconductor fin 18F by a pitch that is from 20 nm to 60 nm; the pitch can be measured from a central portion of one semiconductor fin 18F to a central portion of the nearest neighboring semiconductor fin 18F.

Figure 10:
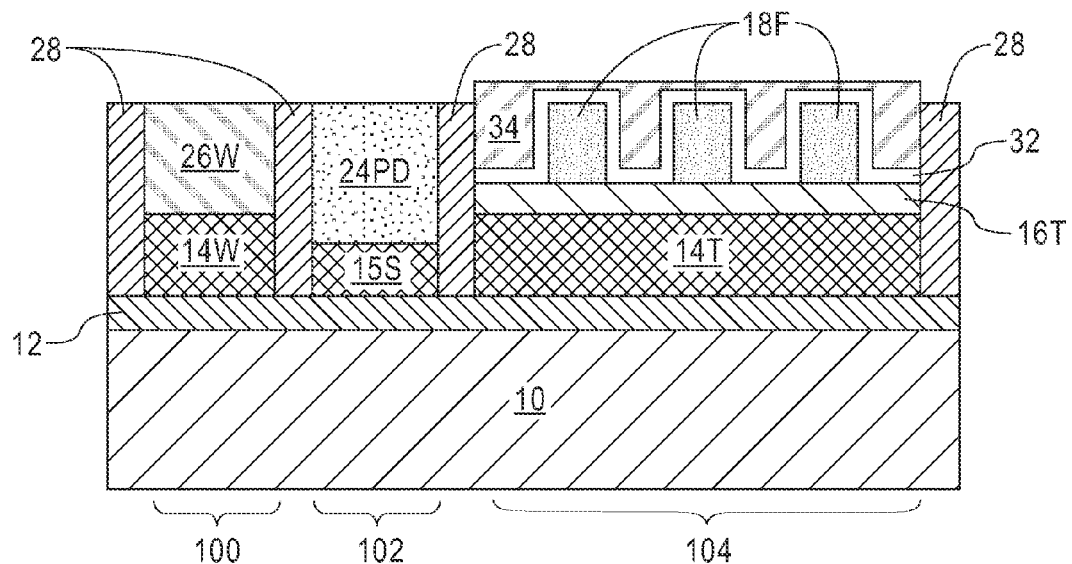
FIG. 10 is a cross sectional view of the exemplary semiconductor structure of FIG. 9 after forming a logic device in the logic device region.

Referring now to FIG. 10, there is illustrated the exemplary semiconductor structure of FIG. 9 after forming a logic device in the logic device region 104. The logic device includes at least one functional gate structure (32, 34). Although the present application describes and illustrates the formation of a single functional gate structure (32, 34), a plurality of functional gate structures (32, 34) can be formed. Each functional gate structure (32, 34) straddles over each semiconductor fin 18F. The term "straddle over" denotes that the functional gate structure spans over each semiconductor fin such that one portion of the functional gate structure is located on one side of the each semiconductor fin 18F and another portion of the function gate structure is located on another side of each semiconductor fin 18F.

By "functional gate structure" it is meant a permanent gate structure used to control output current (i.e., flow of carriers in the channel) of a semiconducting device through electrical or magnetic fields. Each functional gate structure that is formed includes a gate material stack of, from bottom to top, a gate dielectric portion 32 and a gate conductor portion 34. In some embodiments, a gate cap portion (not shown) can be present atop the gate conductor portion 34.

The gate dielectric portion 32 comprises a gate dielectric material. The gate dielectric material that provides the gate dielectric portion 32 can be an oxide, nitride, and/or oxynitride. In one example, the gate dielectric material that provides the gate dielectric portion 32 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 32.

The gate dielectric material used in providing the gate dielectric portion 32 can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion comprises a same gate dielectric material. In other embodiments and when multiple functional gate structures are formed, a first set of the gate dielectric portions may comprise a different gate dielectric material than a second set of the gate dielectric portions. When a different gate dielectric material is used for the gate dielectric portions, block mask technology can be used. In one embodiment of the present application, the gate dielectric material used in providing the gate dielectric portion 32 can have a thickness in a range from 1 nm to 10 nm. Other thicknesses that are lesser than, or greater than, the aforementioned thickness range can also be employed for the gate dielectric material.

The gate conductor portion 34 comprises a gate conductor material. The gate conductor material used in providing the gate conductor portion 34 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments and when multiple functional gate structures are formed, each gate conductor portion may comprise a same gate conductor material. In other embodiments and when multiple functional gate structures are formed, a first set of gate conductor portions comprises a different gate conductor material from a second set of gate conductor portions. In some embodiments, gate conductor portion 34 may comprise an nFET gate metal or a pFET gate metal.

The gate conductor material used in providing the gate conductor portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion 34 has a thickness from 1 nm to 100 nm. Other thicknesses that are lesser than, or greater than, the aforementioned thickness range can also be employed for the gate conductor material used in providing the gate conductor portion 34.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, sacrificial gate structures are first provided instead of functional gate structures. By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion. The sacrificial gate material portion includes one of the gate conductor materials mentioned above for gate conductor portion. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional and/or sacrificial gate structure) source/drain regions (not shown) can be formed utilizing an epitaxial growth process from exposed portions of each of the semiconductor fins 18F that are not protected by the gate structure; the source/drain regions would by located within a plane that runs into and out of the drawing illustrated in FIG. 10. The source/drain regions comprise any semiconductor material including, for example, Si, Ge or silicon germanium alloys. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure (functional gate structure and/or sacrificial gate structure). The gate spacer can be formed by deposition of a gate spacer material, such as, for example, a dielectric oxide, and then etching the deposited gate spacer material by utilizing a spacer etch.

Figure 11:
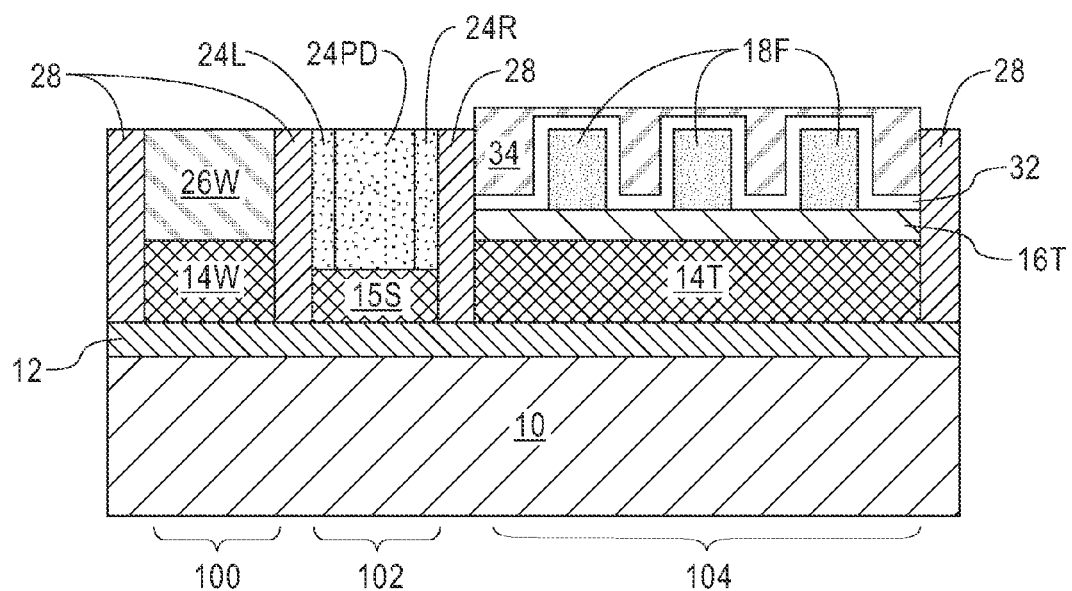
FIG. 11 is a cross sectional view of the exemplary semiconductor structure of FIG. 10 after forming an n-doped region and a p-doped region within a remaining portion of the third semiconductor material layer that is within the photodetector device region in accordance with an embodiment of the present application.

Referring now to FIG. 11, there is illustrated the exemplary semiconductor structure of FIG. 10 after forming an n-doped region 24L and a p-doped region 24R within a remaining portion of the third semiconductor material layer (i.e., the photodetector semiconductor base layer 24PD) that is within the photodetector device region 102 in accordance with an embodiment of the present application. The n-doped region 24L includes an n-type dopant, while the p-type doped region 24R includes a p-type dopant. The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate, examples of n-type dopants, i.e., impurities, include, but are not limited to, antimony, arsenic and phosphorous. The n-doped region 24L and the p-doped region 24R can be formed by introducing appropriate impurities into the photodetector semiconductor base layer 24PD by ion implantation.

Although FIG. 11 describes and illustrates the formation of a lateral photodetector (24L, 24PD, 24R) within the photodetector device region 102, the present application is not limited to such photodetectors. Instead, other photodetectors such as, for example, vertical photodetectors, or quantum well detectors can be formed utilizing techniques that are well known to those skilled in the art.

FIG. 11 shows one exemplary semiconductor structure of the present application. Notably, FIG. 11 shows an insulator layer (i.e., first insulator layer 12) located on an entire surface of handle substrate 10. A waveguide is located atop a first portion of the insulator layer (i.e., first insulator layer 12). The waveguide comprises, from top to bottom, a topmost waveguide dielectric structure 26W, a waveguide core structure 14W comprising a first semiconductor material, and a bottommost waveguide dielectric structure comprising the first portion of the insulator layer (i.e., first insulator layer 12). A photodetector is located above a second portion of the insulator layer (i.e., first insulator layer 12). The photodetector comprises a photodetector semiconductor base layer 24PD comprising a third semiconductor material located on a surface of an epitaxial seed material layer 15S comprising the first semiconductor material. A logic device is spaced apart from the waveguide and the photodetector and located above a third portion of the insulator layer (i.e., the first insulator layer 12). The logic device is present on a surface of an active semiconductor material layer (i.e., semiconductor fins 18F) comprising a second semiconductor material, and the active semiconductor material layer is separated from the third portion of the insulator layer by a local buried insulator layer 16T and a logic device semiconductor material substrate 14T comprising the first semiconductor material. In this embodiment of the present application, the topmost waveguide dielectric structure 26W, the photodetector semiconductor base layer 24PD, and the active semiconductor layer (i.e., fins 18F) have topmost surfaces that are coplanar with each other.

Figure 12:
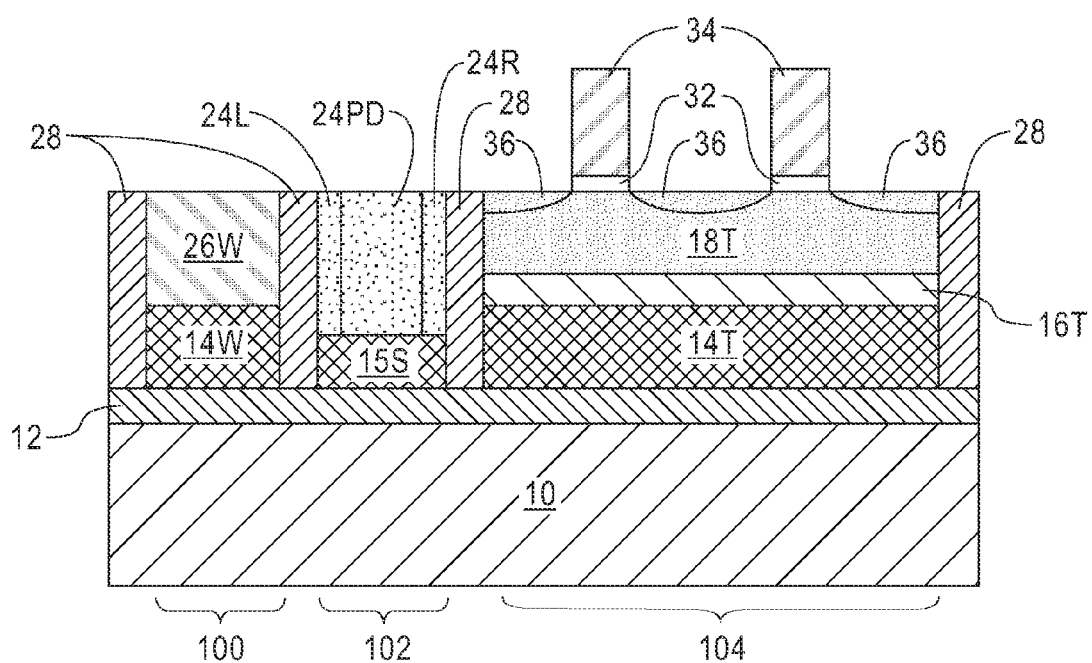
FIG. 12 is a cross sectional view of another exemplary semiconductor structure that can be provided utilizing the method of the present application.

Referring now to FIG. 12, there is illustrated another exemplary semiconductor structure that can be provided utilizing the method of the present application. Notably, FIG. 12 shows an embodiment in which functional gate structures are formed on a planar surface of the active semiconductor material layer 18T. Elements 32 and 34 in these drawings are the same as mentioned above for the functional gate structure shown in FIG. 10. Elements 36 represent source/drain regions that are introduced into the active semiconductor material layer 18T utilizing any well known source/drain ion implantation process. A gate spacer may or may not be present on the sidewalls of the gate dielectric portion 32 and the gate conductor portion 34. The gate dielectric portion 32 and the gate conductor portion 34 are as defined above in FIG. 10 and the functional gate structures can also be formed as defined above in FIG. 10. In this embodiment of the present application, the topmost waveguide dielectric structure 26W, the photodetector semiconductor base layer 24PD, and the active semiconductor layer 18T have topmost surfaces that are coplanar with each other.

Figure 13:
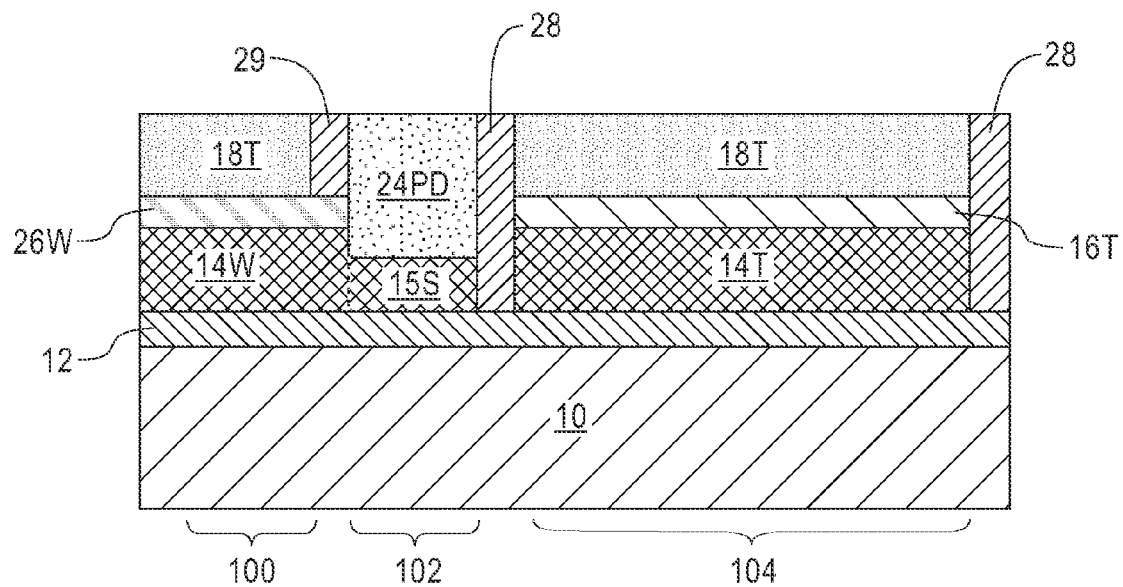
FIG. 13 is a cross sectional view of the exemplary semiconductor structure of FIG. 5 after forming isolation structures to provide a waveguide device region, a photodetector device region and a logic device region in accordance with another embodiment of the present application.

Referring now to FIG. 13, there is illustrated the exemplary semiconductor structure of FIG. 5 after forming isolation structures (28, 29) to provide a waveguide device region 100, a photodetector device region 102 and a logic device region 104 in accordance with another embodiment of the present application. In this embodiment of the present application, one of the isolation structures, i.e., isolation structure 29, does not extend entirely to the first insulator layer 12. Instead, isolation structure 29 stops on a topmost surface of one of the second insulator layer portions 16P.

In this embodiment, the waveguide is buried beneath a remaining portion of one of the active semiconductor layers 18T in which logic devices can be formed. In this embodiment, the waveguide includes a topmost waveguide dielectric structure 24W (i.e., a remaining portion of the second insulator layer portion 16P), a waveguide core structure 14W comprising a remaining portion of the first semiconductor material layer 14, and a bottommost waveguide dielectric structure comprising a portion of the first insulator layer 12. Also, and in this embodiment, the waveguide core structure 14W and the epitaxial seed material layer 15S, which is used to provide the third semiconductor material layer 24 that is used as the photodetector semiconductor base layer 24PD, are directly interconnected.

Also, and in this embodiment, a height of the epitaxial seed material layer 15S is less than a height of the waveguide core structure 14W and the logic device semiconductor material substrate 14T, and the topmost waveguide dielectric structure 26W and the local buried insulator layer 16T comprise a same material (i.e., the second insulator layer 16) and have topmost and bottommost surfaces that are coplanar with each other.

Isolation structures 28, 29 can be formed as described above in providing the isolation structures to the exemplary semiconductor structure shown in FIG. 7.

Figure 14:
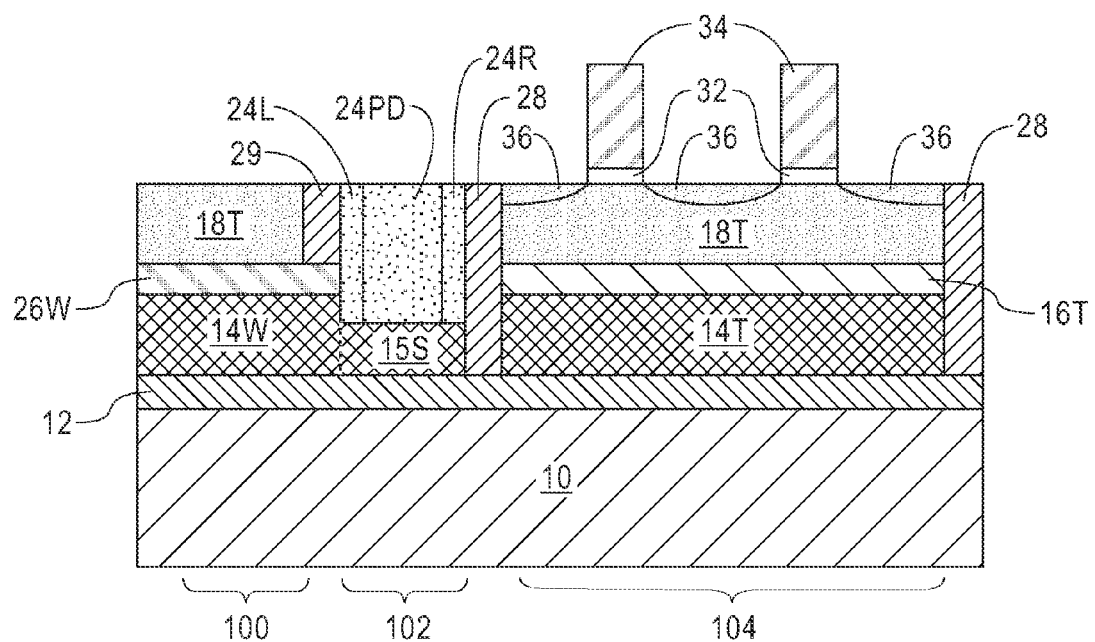
FIG. 14 is a cross sectional view of the exemplary semiconductor structure of FIG. 13 after performing further processes to provide a photodetector in the photodetector device region and a logic device in the logic device region.

Referring now to FIG. 14, there is illustrated the exemplary semiconductor structure of FIG. 13 after performing further processes to provide a photodetector (24L, 24PD, 24R) in the photodetector device region 102 and a logic device (i.e., functional gate structure (32, 24) in the logic device region 104. The photodetector (24L, 24PD, 24R) and the logic device (i.e., functional gate structure (32, 34) can be formed utilizing the processes and materials mentioned above in regard to providing the exemplary semiconductor structures shown in FIGS. 11 and 12. In some embodiments (not shown), semiconductor fins as described above can be processed from the active semiconductor material layer 18T prior to forming the logic device.

It should be noted that although the present application describes and illustrates the formation of the waveguide first, the logic device second and the photodetector third, the present application is not limited to such an order. Instead, the present application works when the various devices are formed in different orders.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:

providing a substrate comprising, from bottom to top, a handle substrate, a first insulator layer, a first semiconductor material layer, a second insulator layer, and a second semiconductor material layer;

forming an opening that extends entirely through said second semiconductor material layer and entirely through said second insulator layer, and partially into said first semiconductor material layer;

forming a third semiconductor material layer in said opening, said third semiconductor material layer having a bottommost surface that contacts a reduced thickness material portion of said first semiconductor material layer that is located under said opening;

forming isolation structures in said semiconductor substrate to provide a waveguide device region, a photodetector device region and a logic device region, wherein during said forming said isolation structures, portions of said first semiconductor material layer, portions of said third semiconductor material layer and portions of said second semiconductor material layer are removed, and wherein said waveguide device regions comprises a first remaining portion of said first semiconductor material layer, said photodetector device region comprises a remaining portion of said third semiconductor material layer and said reduced thickness material portion of said first semiconductor material layer, and said logic device region comprises a remaining portion of said second semiconductor material layer, a remaining portion of said second insulator layer, and a second remaining portion of said first semiconductor material layer; and forming, in any order, a logic device on a surface of said remaining portion of said second semiconductor material layer in said logic device region, and a photodetector device in said third semiconductor material layer in said photodetector device region.

2. The method of claim 1, further comprising removing another remaining portion of said second semiconductor material layer and another remaining portion of said second insulator layer from said first remaining portion of the first semiconductor material layer and forming a topmost waveguide dielectric structure on said first remaining portion of said first semiconductor material layer prior to forming said isolation structures.

3. The method of claim 2, wherein each isolation structure extends to a topmost surface of said first insulator layer.

4. The method of claim 1, wherein one of said isolation structures that is present between the waveguide device region and said photodetector device region extends to a topmost surface of said second insulator layer.

5. The method of claim 1, wherein said forming said third semiconductor material layer comprises an epitaxial growth process and said reduced thickness material portion of said first semiconductor material layer that is located under said opening serves as an epitaxial seed layer.

6. The method of claim 1, wherein said forming said photodetector device includes providing n-type doped region and p-type doped region into portions of said remaining portion of said third semiconductor material layer.

7. The method of claim 1, wherein said forming said logic device comprises patterning said remaining portion of said second semiconductor material layer to provide a plurality of semiconductor fins extending upwards from said remaining portion of said second insulator layer.

8. The method of claim 7, wherein said remaining portion of said second semiconductor material layer in said logic device region is patterned by a sidewall image transfer process.

9. The method of claim 7, wherein said forming said logic device further comprises forming a functional gate structure that straddles over each semiconductor fin of said plurality of semiconductor fins.

10. The method of claim 1, wherein said forming said logic device comprises providing a functional gate structure on said remaining portion of said second semiconductor material layer in said logic device region.

11. A semiconductor structure comprising:
an insulator layer located on an entire surface of a handle substrate;
a waveguide located atop a first portion of said insulator layer, said waveguide comprising, from top to bottom, a topmost waveguide dielectric structure, a waveguide core structure comprising a first semiconductor material, and a bottommost waveguide dielectric structure comprising said first portion of said insulator layer;
a photodetector located above a second portion of said insulator layer, wherein said photodetector comprises a photodetector semiconductor base layer located on a surface of an epitaxial seed material layer, wherein said photodetector semiconductor base layer comprises a third semiconductor material and said epitaxial seed material layer comprises said first semiconductor material; and
a logic device spaced apart from said waveguide and said photodetector and located above a third portion of said insulator layer, wherein said logic device is present on a surface of an active semiconductor material layer comprising a second semiconductor material, wherein said active semiconductor material layer is separated from said third portion of said insulator layer by a local buried insulator layer, and a logic device semiconductor material substrate comprising said first semiconductor material.

12. The semiconductor structure of claim 11, further comprising an isolation structure located between said waveguide and said photodetector and another isolation structure located between said logic device and each of said waveguide and said photodetector.

13. The semiconductor structure of claim 11, wherein a height of said epitaxial seed material layer is less than a height of said waveguide core structure and said logic device semiconductor material substrate.

14. The semiconductor structure of claim 11, wherein said active semiconductor material layer comprises at least one semiconductor fin.

15. The semiconductor structure of claim 11, wherein said topmost waveguide dielectric structure, said photodetector semiconductor base layer, and said active semiconductor layer have topmost surfaces that are coplanar with each other.

16. The semiconductor structure of claim 11, wherein said photodetector further includes an n-type doped region and a p-type doped region located within said photodetector semiconductor base layer.

17. The semiconductor structure of claim 11, wherein said photodetector semiconductor base layer comprising said third semiconductor material has a same crystal structure as said epitaxial seed material layer comprising said first semiconductor material.

18. The semiconductor structure of claim 11, wherein said topmost waveguide dielectric structure of said photodetector is buried beneath another active semiconductor layer of said second semiconductor material.

19. The semiconductor structure of claim 18, wherein a height of said epitaxial seed material layer is less than a height of said waveguide core structure and said logic device semiconductor material substrate, and wherein said topmost waveguide dielectric structure and said local buried insulator layer comprise a same material and have topmost and bottommost surfaces that are coplanar with each other.

20. The semiconductor structure of claim 11, wherein said first semiconductor material comprises silicon, said second semiconductor material comprises germanium, a silicon germanium alloy or a III-V compound semiconductor and said third semiconductor material comprises silicon, germanium or a silicon germanium alloy.

* * * * *